(12) United States Patent
Su et al.

(10) Patent No.: US 11,488,989 B2
(45) Date of Patent: Nov. 1, 2022

(54) CAPACITOR, ARRAY SUBSTRATE AND METHOD FOR MANUFACTURING THE SAME, AND DISPLAY PANEL

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Tongshang Su, Beijing (CN); Dongfang Wang, Beijing (CN); Qinghe Wang, Beijing (CN)

(73) Assignees: HEFEI XINSHENG OPTOELECTRONICS TECHNOLOGY CO., LTD., Anhui (CN); BEIJING BOE TECHNOLOGY DEVELOPMENT CO., LTD., Beijing (CN)

(*) Notice: Subject to any disclaimer, the term of this patent is extended or adjusted under 35 U.S.C. 154(b) by 224 days.

(21) Appl. No.: 16/885,456

(22) Filed: May 28, 2020

(65) Prior Publication Data

US 2021/0057459 A1    Feb. 25, 2021

(30) Foreign Application Priority Data

Aug. 22, 2019    (CN) .......................... 201910779410.3

(51) Int. Cl.
*H01L 27/12* (2006.01)
*H01L 29/786* (2006.01)
*H01L 49/02* (2006.01)

(52) U.S. Cl.
CPC ...... *H01L 27/1255* (2013.01); *H01L 27/1259* (2013.01); *H01L 28/88* (2013.01); *H01L 29/78633* (2013.01)

(58) Field of Classification Search
None
See application file for complete search history.

(56) References Cited

U.S. PATENT DOCUMENTS

2018/0040678 A1* 2/2018 Zhai ...................... G06F 3/0412
2018/0114491 A1* 4/2018 Tokuda ............... H01L 51/0097

FOREIGN PATENT DOCUMENTS

CN    104795428 A    7/2015
CN    107785399 A    3/2018
(Continued)

OTHER PUBLICATIONS

First Office Action dated Jul. 31, 2020 for application No. CN201910//9410.3 with English translation attached.

*Primary Examiner* — Bo B Jang
(74) *Attorney, Agent, or Firm* — Nath, Goldberg & Meyer; Joshua B. Goldberg

(57) ABSTRACT

A capacitor, an array substrate and a method for manufacturing the same, and a display panel are provided. The capacitor includes a main body including a first pole plate and a second pole plate disposed opposite to each other, and the capacitor further includes at least one auxiliary body. Any one of the at least one auxiliary body includes a third pole plate and a fourth pole plate disposed opposite to each other, and neither the third pole plate nor the fourth pole plate extends in a plane where the first pole plate is located or a plane where the second pole plate is located. The main body is connected in parallel with the at least one auxiliary body. The array substrate includes a transistor and the capacitor provided by the present disclosure, and the transistor is electrically connected to the capacitor.

12 Claims, 5 Drawing Sheets

(56) References Cited

FOREIGN PATENT DOCUMENTS

| | | | |
|---|---|---|---|
| CN | 108010945 | A | 5/2018 |
| CN | 109786430 | A | 5/2019 |

\* cited by examiner

CAPACITOR, ARRAY SUBSTRATE AND METHOD FOR MANUFACTURING THE SAME, AND DISPLAY PANEL

CROSS-REFERENCE TO RELATED APPLICATIONS

The present application claims the priority from Chinese Patent Application No. 201910779410.3, filed with the Chinese Patent Office on Aug. 22, 2019, the content of which is hereby incorporated herein by reference in its entirety.

TECHNICAL FIELD

The present disclosure belongs to the field of display technology, and particularly relates to a capacitor, an array substrate and a method for manufacturing the same, and a display panel.

BACKGROUND

A manufacturing process of an array substrate including a top-gate thin film transistor is simple, and a parasitic capacitance Cgs between a gate and both source and drain of the top-gate thin film transistor is small, so such an array substrate has been widely used. As shown in FIG. 1, for a capacitor 4 in the related array substrate including a top-gate thin film transistor 3, with the increased display resolution and refresh rate, a width (for example, the size in the horizontal direction in FIG. 1) of a metal pole plate of the capacitor 4 is greatly reduced, and a thickness (for example, the size in the vertical direction in FIG. 1) of the metal pole plate will be increased. In order to achieve the better step coverage in the manufacturing process of the array substrate, a thickness of the corresponding insulation layer will also be increased, to thereby increase a distance between two pole plates of the capacitor 4, so that a capacitance value of the capacitor 4 is significantly decreased, and the decrease in the capacitance value of the capacitor 4 will seriously degrade the display effect. Therefore, it is necessary to develop a method of increasing the capacitance value.

SUMMARY

According to an aspect of embodiments of the present disclosure, a capacitor is provided, including a main body that includes a first pole plate and a second pole plate disposed opposite to each other; the capacitor further includes at least one auxiliary body, wherein: any one of the at least one auxiliary body includes a third pole plate and a fourth pole plate disposed opposite to each other, and neither the third pole plate nor the fourth pole plate extends in a plane where the first pole plate is located or a plane where the second pole plate is located; and the main body is connected in parallel with the at least one auxiliary body.

In a possible embodiment, both the third pole plate and the fourth pole plate are located in a region between the first pole plate and the second pole plate; or at least one of the third pole plate and the fourth pole plate is located outside a region between the first pole plate and the second pole plate.

According to another aspect of embodiments of the present disclosure, an array substrate is provided, including a transistor and the capacitor provided according to the embodiments of the present disclosure, and the transistor is electrically connected to the capacitor.

In a possible embodiment, the array substrate further includes a first insulation layer and a second insulation layer stacked on the first insulation layer, wherein: the arrangement direction of the first pole plate and the second pole plate is parallel to the arrangement direction of the first insulation layer and the second insulation layer, and the arrangement direction of the third pole plate and the fourth pole plate is perpendicular to the arrangement direction of the first pole plate and the second pole plate; and the transistor includes a source, a drain and an active layer; wherein the active layer and at least one part of the auxiliary body are located in the first insulation layer, the source, the drain and the second pole plate are located in the second insulation layer, and the first pole plate is located on the second insulation layer.

In a possible embodiment, the array substrate further includes a third insulation layer stacked under the first insulation layer, and at least one part of the auxiliary body is located in the third insulation layer.

In a possible embodiment, the first pole plate and the third pole plate extend respectively to be connected with each other, or the first pole plate and the third pole plate are electrically connected by a wire; and the second pole plate and the fourth pole plate extend respectively to be connected with each other, or the second pole plate and the fourth pole plate are electrically connected by a wire.

In a possible embodiment, the materials of the first pole plate and the third pole plate are same; and/or the materials of the second pole plate, the fourth pole plate, the source and the drain are same.

According to yet another aspect of embodiments of the present disclosure, a display panel is provided; including the array substrate provided according to the embodiments of the present disclosure.

According to still another aspect of embodiments of the present disclosure, a method for manufacturing the above-mentioned array substrate is provided, the method including: forming a first insulation layer on a base; wherein an active layer of the transistor is arranged in the first insulation layer, and at least one first via hole is arranged in an upper portion of the first insulation layer distal to the base; forming at least one fourth pole plate of the capacitor respectively in the at least one first via hole, and forming a source of the transistor, a drain of the transistor and the second pole plate of the capacitor on the first insulation layer; wherein the second pole plate is electrically connected to the at least one fourth pole plate, and the source and the drain are electrically connected to the active layer respectively; forming a second insulation layer on the first insulation layer; wherein at least one second via hole penetrates the second insulation layer and extends into the first insulation layer; and forming at least one third pole plate of the capacitor respectively in the at least one second via hole, and forming the first pole plate of the capacitor on the second insulation layer; wherein the first pole plate is electrically connected to the drain and the at least one third pole plate respectively, and the orthographic projection of the first pole plate on the base at least partially covers the orthographic projection of the second pole plate on the base.

In a possible embodiment, forming the first insulation layer on the base includes: forming the active layer on the base; depositing a first insulating material on the base to form the first insulation layer; and etching the first insulation layer to form the at least one first via hole and two third via holes; wherein the orthographic projection of the at least one first via hole on the base is located outside a range of the orthographic projection of the active layer on the base, and the two third via holes extend to the active layer respectively.

In a possible embodiment, forming the at least one fourth pole plate, the source, the drain and the second pole plate includes: depositing a first metal material on the first insulation layer, in the at least one first via hole and in the two third via holes to form the at least one fourth pole plate in the at least one first via hole respectively; and etching the first metal material by a patterning process to form the source, the drain and the second pole plate; wherein the orthographic projection of the second pole plate on the base is located outside the range of the orthographic projection of the active layer on the base, the source is connected to the active layer through the first metal material deposited in one of the two third via holes, and the drain is connected to the active layer through the first metal material deposited in the other of the two third via holes.

In a possible embodiment, forming the second insulation layer on the first insulation layer includes: depositing a second insulating material on the first insulation layer to form the second insulation layer; etching the second insulation layer and the first insulation layer to form the at least one second via hole; wherein the orthographic projection of the at least one second via hole on the base is located outside the range of the orthographic projection of the active layer on the base and outside the range of the orthographic projection of the second pole plate on the base; and etching the second insulation layer to form a fourth via hole extending to the drain from a side of the second insulation layer distal to the first insulation layer.

In a possible embodiment, forming the at least one third pole plate and the first pole plate includes: depositing a second metal material on the second insulation layer, in the at least one second via hole and in the fourth via hole to form the at least one third pole plate in the at least one second via hole respectively; and etching the second metal material by a patterning process to form the first pole plate, wherein the first pole plate is connected to the drain through the second metal material deposited in the fourth via hole.

In a possible embodiment, the base includes a third insulation layer; and forming the first insulation layer on the base includes: forming the active layer on the third insulation layer, and depositing the first insulating material on the third insulation layer to form the first insulation layer.

In a possible embodiment, the at least one first via hole penetrates the first insulation layer and extends into the third insulation layer; and/or the at least one second via hole penetrates the first insulation layer and extends into the third insulation layer.

DETAILED DESCRIPTION

Figure 1:
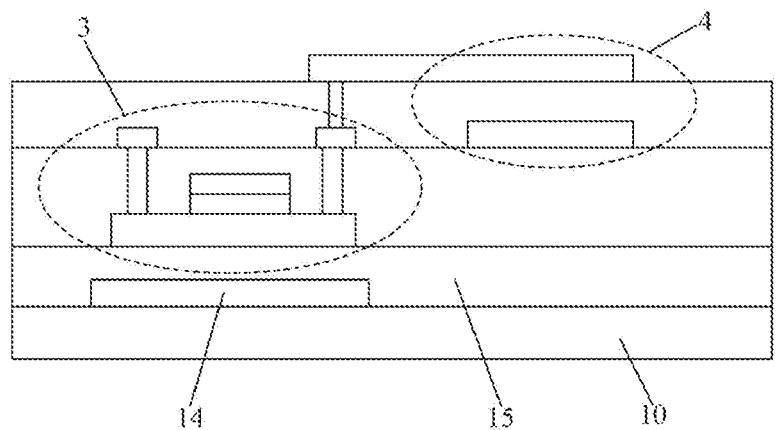
FIG. 1 is a structural section view of the transistor and the capacitor in an array substrate in the related art.

In order to enable one of ordinary skill in the art to better understand the technical solutions of the disclosure, the capacitor, the array substrate and the method for manufacturing the same, and the display panel provided by embodiments of the present disclosure will be further described below in details with reference to the accompanying drawings and exemplary embodiments.

An embodiment of the present disclosure provides a capacitor, which may include a main body 1 composed of a first pole plate 11 and a second pole plate 12 disposed Opposite to each other and a dielectric layer disposed between the first pole plate 11 and the second pole plate 12; the capacitor further includes at least one auxiliary body 2 composed of a third pole plate 21, a fourth pole plate 22 and a dielectric layer located in a facing region (i.e., a region in which the third pole plate 21 and the fourth pole plate 22 overlap each other in a stacking direction (e.g., the horizontal direction in FIG. 2) of the third pole plate 21 and the fourth pole plate 22) between the third pole plate 21 and the fourth pole plate 22; the main body 1 and the auxiliary body 2 are disposed in different planes, in other words, neither the third pole plate 21 nor the fourth pole plate 22 extends in the plane where the first pole plate 11 is located or the plane where the second pole plate 12 is located; and the main body 1 is connected in parallel with the at least one auxiliary body 2.

Figure 6:
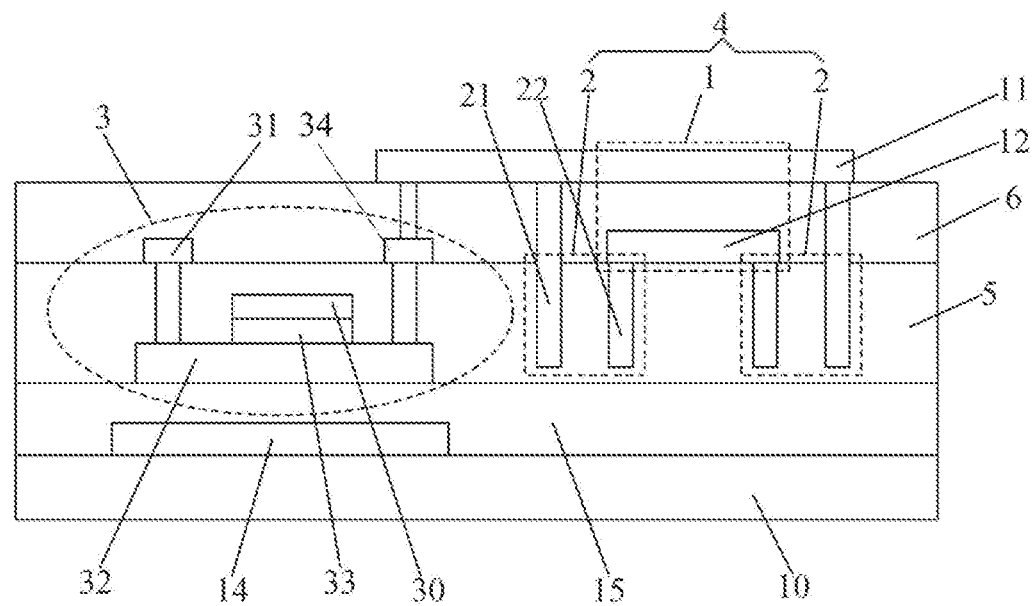
FIG. 6 is a partial structural section view of an array substrate provided by an embodiment of the present disclosure.

By arranging the main body 1 and the at least one auxiliary body 2 in different planes respectively, and connecting the main body 1 and the at least one auxiliary body 2 in parallel to constitute the capacitor, a capacitance value of the capacitor may be increased without increasing an area of an orthographic projection of the capacitor on a base, for example, a base 10 as shown in FIG. 6 (i.e., without increasing the area of the array substrate occupied by the capacitor).

Figure 2:
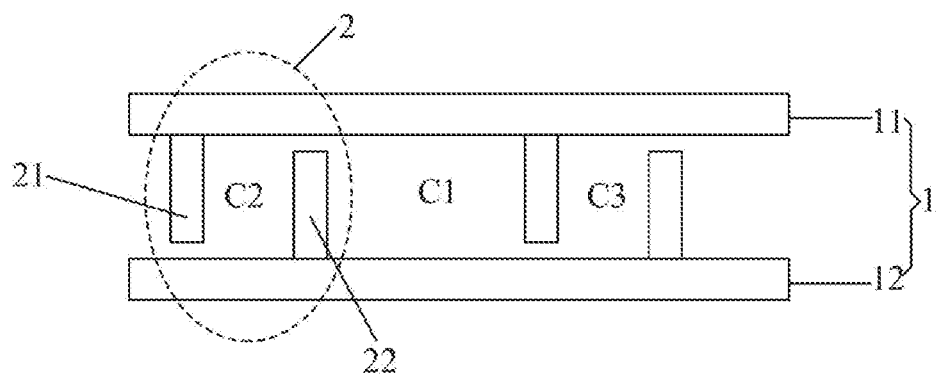
FIG. 2 is a structural section view of a capacitor provided by an embodiment of the present disclosure.

As shown in FIG. 2, it is a structural section view of a capacitor provided by an embodiment of the present disclosure. The third pole plate 21 is disposed on the first pole plate 11 and is perpendicular to the first pole plate 11, and the fourth pole plate 22 is disposed on the second pole plate 12 and is perpendicular to the second pole plate 12. For example, the third pole plate 21 may be electrically connected to the first pole plate 11, and the fourth pole plate 22 may be electrically connected to the second pole plate 12. Facing portions (i.e., a portion of the third pole plate 21 and a portion of the fourth pole plate 22 overlap each other in a stacking direction (e.g., the horizontal direction in FIG. 2) of the third pole plate 21 and the fourth pole plate 22) of the third pole plate 21 and the fourth pole plate 22 and the dielectric layer between the facing portions can form a capacitor. In a possible embodiment, there may be multiple auxiliary bodies 2; for example, the number of auxiliary bodies 2 is two in FIG. 2, and in this case, according to the calculation formula of the capacitance value of the multiple parallel-connected capacitors, the capacitance value of the capacitor is C=C1+C2+C3; wherein C1 is the capacitance value of the main body 1; C2 is the capacitance value of one auxiliary body 2; and C3 is the capacitance value of the other auxiliary body 2.

Figure 3:
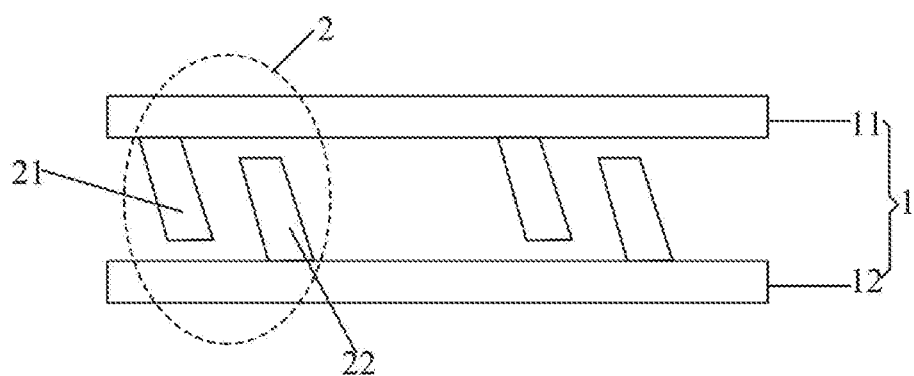
FIG. 3 is another structural section view of a capacitor provided by an embodiment of the present disclosure.

As shown in FIG. 3, which is another structural section view of a capacitor provided by an embodiment of the present disclosure, the third pole plate 21 is disposed on the first pole plate 11 and forms an angle that is not 90° relative to the first pole plate 11, the fourth pole plate 22 is disposed on the second pole plate 12 and forms an angle that is not 90° relative to the second pole plate 12, and the facing portions of the third pole plate 21 and the fourth pole plate 22 and the dielectric layer between the facing portions can form a capacitor. For example, each pair of third pole plate 21 and fourth pole plate 22 may be parallel to each other, to maximize the capacitance value formed by this pair of pole plates.

Figure 4:
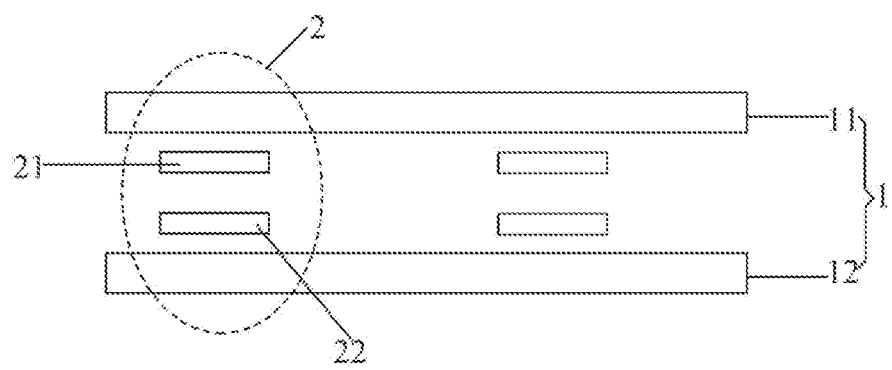
FIG. 4 is yet another structural section view of a capacitor provided by an embodiment of the present disclosure.

As shown in FIG. 4, which is yet another structural section view of a capacitor provided by an embodiment of the present disclosure, the third pole plate 21 is parallel to the first pole plate 11, the fourth pole plate 22 is parallel to the second pole plate 12, and the facing portions of the third pole plate 21 and the fourth pole plate 22 and the dielectric layer between the facing portions can form a capacitor.

Figure 5:
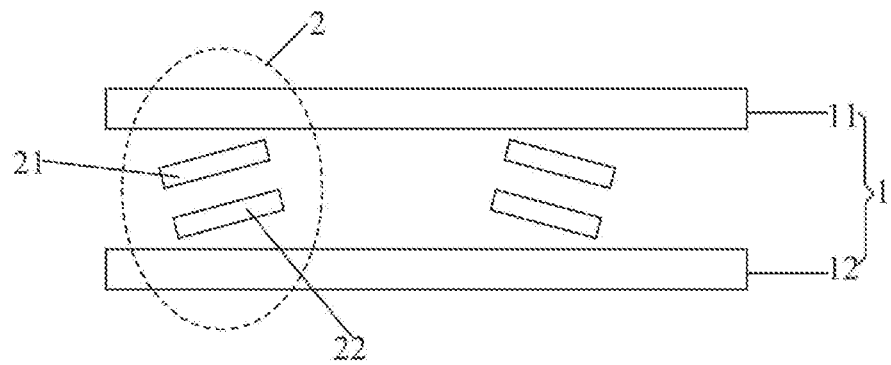
FIG. 5 is still another structural section view of a capacitor provided by an embodiment of the present disclosure.

As shown in FIG. 5, which is still another structural section view of a capacitor provided by an embodiment of the present disclosure, the third pole plate 21 is not parallel to the first pole plate 11, the fourth pole plate 22 is not parallel to the second pole plate 12, and the facing portions of the third pole plate 21 and the fourth pole plate 22 and the dielectric layer between the facing portions can form a capacitor. Similarly, each pair of third pole plate 21 and fourth pole plate 22 may be parallel to each other, to maximize the capacitance value formed by this pair of pole plates. Furthermore, in FIGS. 4 and 5, each third pole plate 21 may be electrically connected to the first pole plate 11, and each fourth pole plate 22 may be electrically connected to the second pole plate 12.

FIG. 6 is still another structural section view of the capacitor 4 provided by an embodiment of the present disclosure. In the capacitor 4, the third pole plate 21 is located on the side of the first pole plate 11 proximal to the second pole plate 12 and is perpendicular to the first pole plate 11; the fourth pole plate 22 is located on the side of the second pole plate 12 distal to the first pole plate 11 and is perpendicular to the second pole plate 12; and the facing portions (as shown by two dotted rectangular frames in the middle on the right side of FIG. 6) of the third pole plate 21 and the fourth pole plate 22 and the insulation layer between the facing portions can form a capacitor.

The structure of each auxiliary body 2 of the capacitor provided by the embodiments of the present disclosure may also be any of other structures (for example, the structure shown in FIG. 6) than the structures shown in FIGS. 2-5 as long as the auxiliary body 2 and the main body 1 are not arranged in the same plane, that is, the third pole plate 21 and the first pole plate 11 do not extend in the same plane, and the fourth pole plate 22 and the second pole plate 12 do not extend in the same plane. The capacitor structure in which the main body 1 and the auxiliary body 2 are connected in parallel to each other is within the protection scope of the present disclosure, which will not be repeated here.

An embodiment of the present disclosure further provides an array substrate, as shown in FIG. 6 that is a partial structural section view of the array substrate provided by the embodiment of the present disclosure. The array substrate may include a transistor 3 and the capacitor 4 provided according to the embodiments of the present disclosure, and the transistor 3 is electrically connected to the capacitor 4. The capacitor 4 includes a main body 1 and at least one auxiliary body 2 formed in an insulation layer of the array substrate, and the main body 1 is connected in parallel with each auxiliary body 2.

By forming at least one auxiliary body 2 in the insulation layer of the array substrate and connecting the at least one auxiliary body 2 with the main body 1 in parallel, the capacitance value of the capacitor 4 is the sum of the capacitance value of the main body 1 and the capacitance value of the at least one auxiliary body 2. In this way, in the case that the display resolution and refresh rate of the array substrate are increased and the width of the pole plate is reduced to thereby reduce the capacitance value, a facing area of two pole plates of the capacitor 4 is increased relatively, and the capacitance value of the capacitor 4 is increased.

According to an embodiment provided by the present disclosure, the insulation layer of the array substrate may include a first insulation layer 5 and a second insulation layer 6 stacked on the first insulation layer 5; an active layer 32 of the transistor 3 is located in the first insulation layer 5 and may be located on the upper surface of a third insulation layer 15, and a source 31 and a drain 34 of the transistor 3 are located in the second insulation layer 6. The main body 1 of the capacitor 4 includes a first pole plate 11 on the second insulation layer 6 and a second pole plate 12 disposed in the same layer as the source 31 and the drain 34; each auxiliary body 2 of the capacitor 4 may include a third pole plate 21 with the same material as the first pole plate 11 and formed in the first insulation layer 5, and a fourth pole plate 22 with the same material as the source 31 and the drain 34 and formed in the first insulation layer 5. Here, the first pole plate 11 may be a pixel electrode of a pixel unit, that is, the pixel electrode may serve as one pole plate of the capacitor 4. In such arrangement, the fourth pole plate 22 can be formed while the source 31 and the drain 34 of the transistor 3 are formed, and the third pole plate 21 can be formed while the pixel electrode (i.e., the first pole plate 11) is formed, so that manufacturing processes of the array substrate will not be increased additionally.

According to an embodiment provided by the present disclosure, the first pole plate 11 and the third pole plate 21 may extend respectively to be connected with each other, and/or the second pole plate 12 and the fourth pole plate 22 may extend respectively to be connected with each other; the third pole plate 21 may be perpendicular to the first pole plate 11, and/or the fourth pole plate 22 may be perpendicular to the second pole plate 12. Such arrangement is equivalent to increasing the facing area of the first pole plate 11 and the second pole plate 12 without increasing the areas of the orthographic projections of the first pole plate 11 and the second pole plate 12 on the base 10, to thereby increase the capacitance value of the capacitor 4 and have no influence on the increase in the display resolution and refresh rate of the array substrate.

According to an embodiment provided by the present disclosure, the first pole plate 11 and the third pole plate 21 may also be electrically connected to each other by a wire, and/or the second pole plate 12 and the fourth pole plate 22 may also be electrically connected to each other by a wire, which can also achieve the purpose of relatively increasing the facing area of the first pole plate 11 and the second pole plate 12 to thereby increase the capacitance value of the capacitor 4.

According to an embodiment provided by the present disclosure, without considering the complexity of the preparation process, the third pole plate 21 and the first pole plate 11 may form an angle not being 90° therebetween, and/or the fourth pole plate 22 and the second pole plate 12 may form an angle not being 90° therebetween, as long as the third pole plate 21, the fourth pole plate 22 and the insulating material between the third pole plate 21 and the fourth pole plate 22 can form a capacitor.

Figure 7:
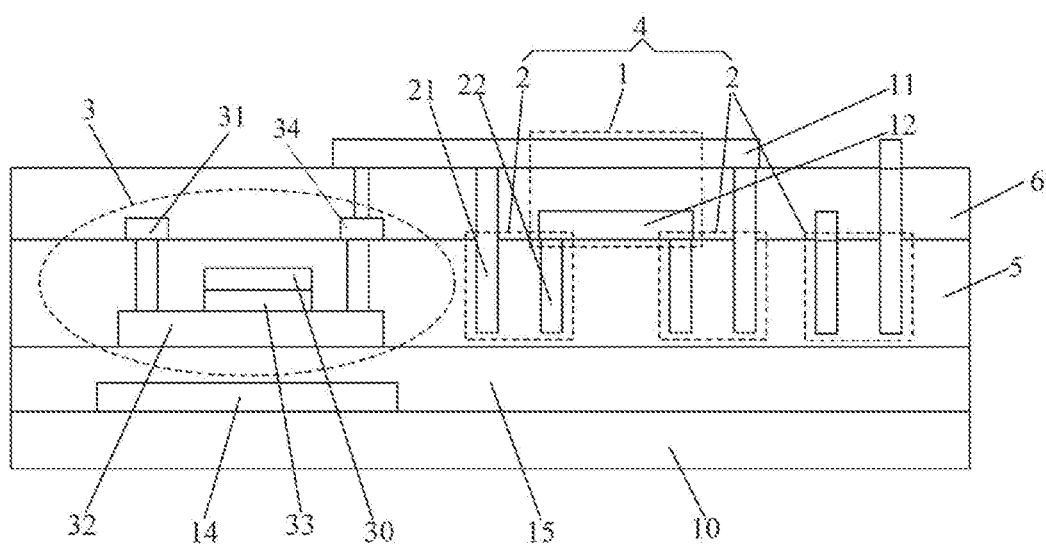
FIG. 7 is another partial structural section view of an array substrate provided by an embodiment of the present disclosure.

In a possible embodiment, the number of auxiliary bodies 2 may be two. Alternatively, the number of auxiliary bodies 2 may also be three or more (as shown in FIG. 7). The more the number of auxiliary bodies 2 is, the greater the relative increase in the capacitance value of the capacitor 4 is when the capacitance value of the body part 1 is unchanged.

According to an embodiment provided by the present disclosure, the transistor 3 may include a top-gate transistor. The manufacturing process of the array substrate including the top-gate transistor is simple, and the parasitic capacitance between the gate 30 and both the source 31 and the drain 34 of the transistor is small, which can significantly improve the display performance of the array substrate.

According to an embodiment provided by the present disclosure, the array substrate may further include a base 10, a light shielding layer 14 and a third insulation layer 15 disposed on the base 10 sequentially, where the orthographic projection of the light shielding layer 14 on the base 10 at least covers the orthographic projection of the active layer 32 on the base 10, and the light shielding layer 14 can form a light shield for the active layer 32, so as to avoid the increase in the leakage current of the transistor 3. The third insulation layer 15 is formed on the light shielding layer 14, and the arrangement of the third insulation layer 15 facilitates the formation of the active layer 32 thereon. A gate insulation layer 33 is further arranged between the gate 30 and the active layer 32 of the transistor 3. The other structures of the array substrate will not be repeated here.

In addition to providing the above structure of the array substrate, an embodiment of the present disclosure further provides a method for manufacturing the array substrate. As shown in FIGS. 8-11, the method for manufacturing the array substrate may include, for example, the following steps S01-S04.

Figure 8:
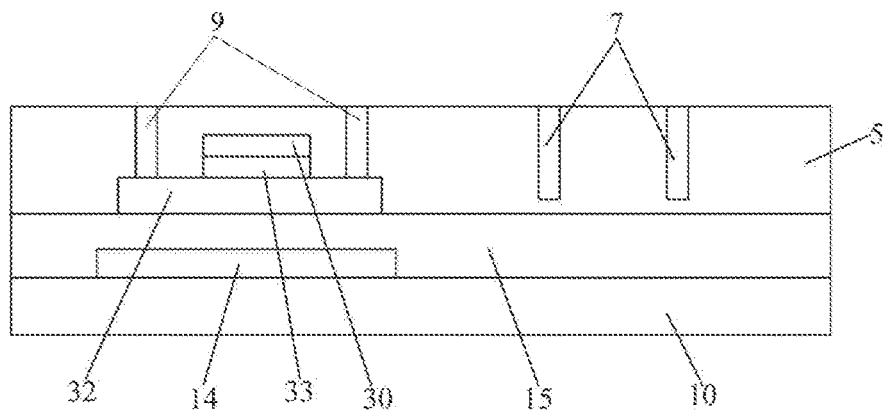
FIGS. 8 to 11 are structural schematic diagrams of steps in the process of forming an array substrate provided by an embodiment of the present disclosure.

In step S101, as shown in FIG. 8, a first insulation layer 5 is formed on a base 10; wherein an active layer 32 of a transistor 3 is arranged in the first insulation layer 5, and at least one first via hole 7 is arranged in an upper portion of the first insulation layer 5 distal to the base 10.

Figure 9:
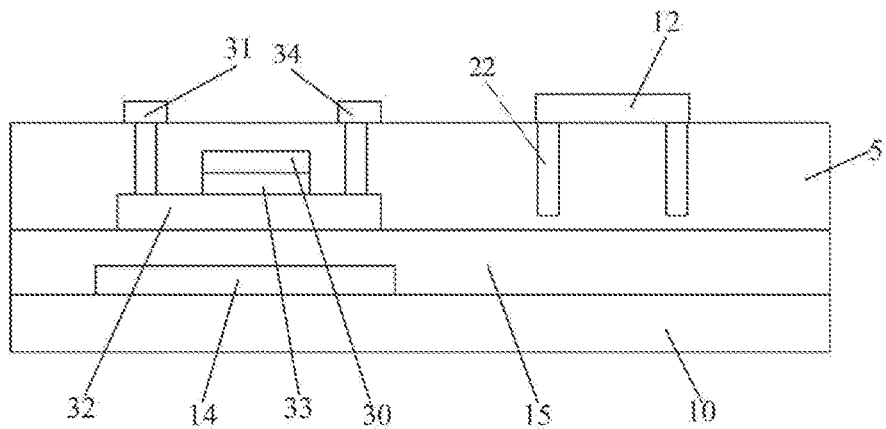

In step S102, as shown in FIG. 9, at least one fourth pole plate 22 of the capacitor 4 is formed respectively in the at least one first via hole 7, and the source 31 of the transistor 3, the drain 34 of the transistor 3 and a second pole plate 12 of the capacitor 4 are formed on the first insulation layer 5 (for example, on the upper surface of the first insulation layer 5); wherein the second pole plate 12 is electrically connected to the at least one fourth pole plate 22, and the source 31 and the drain 34 are electrically connected to the active layer 32 respectively.

Figure 10:
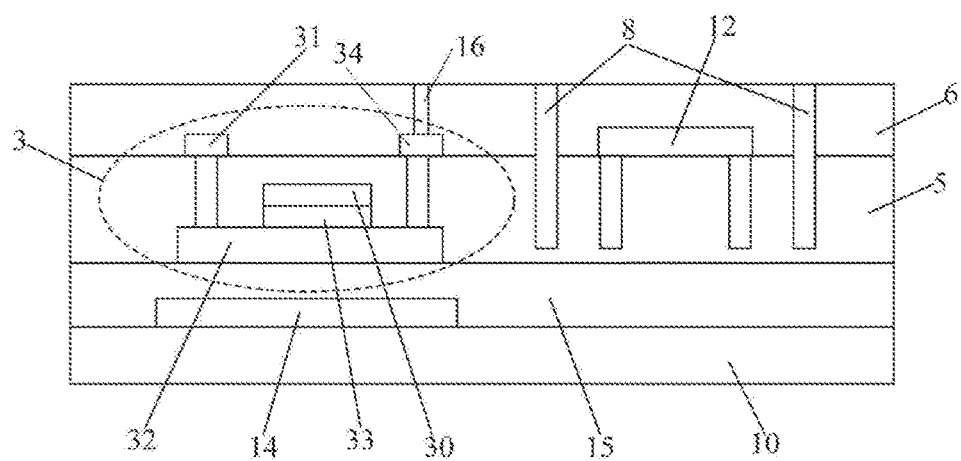

In step S103, as shown in FIG. 10, a second insulation layer 6 is formed on the first insulation layer 5; wherein at least one second via hole 8 penetrates the second insulation layer 6 and extends into the first insulation layer 5.

Figure 11:
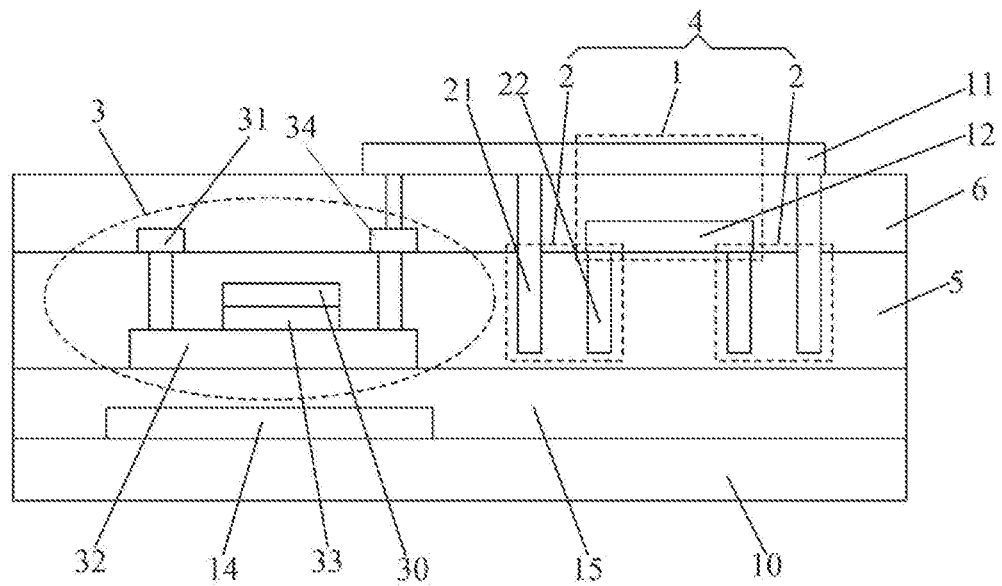

In step S104, as shown in FIG. 11, at least one third pole plate 21 of the capacitor 4 is formed respectively in the at least one second via hole 8, and a first pole plate 11 of the capacitor 4 is formed on the second insulation layer 6 (for example, on the upper surface of the second insulation layer 6); wherein the first pole plate 11 is electrically connected to the drain 34 and the at least one third plate 21 respectively, and the orthographic projection of the first pole plate 11 on the base 10 at least partially covers the orthographic projection of the second pole plate 12 on the base 10.

Here, the first pole plate 11 may be a pixel electrode of a pixel unit, that is, in step S104, a pixel electrode is formed on the second insulation layer 6, where the pixel electrode may serve as a pole plate of the capacitor 4.

According to the method for manufacturing the array substrate provided by the embodiments of the present disclosure, the fourth pole plate 22 can be formed while the source 31 and the drain 34 of the transistor 3 are formed, and the third pole plate can be formed while the pixel electrode (i.e., the first pole plate 11) is formed, so that the manufacturing processes of the array substrate may not be increased additionally while the capacitance value of capacitor 4 is increased.

According to an embodiment provided by the present disclosure, the step S101 of forming the first insulation layer 5 on the base 10 may include: forming the active layer 32 on the base 10; depositing a first insulating material on the base 10 to form the first insulation layer 5; and etching the first insulation layer 5 to form at least one first via hole 7 and two third via holes 9; wherein the orthographic projection of the at least one first via hole 7 on the base 10 is located outside the range of the orthographic projection of the active layer 32 on the base 10, and two third via holes 9 extend to the active layer 32 respectively.

According to an embodiment provided by the present disclosure, the step S102 of forming at least one fourth pole plate 22, the source 31, the drain 34 and the second pole plate 12 may include: depositing a first metal material on the first insulation layer 5, in the at least one first via hole 7 and in the two third via holes 9 to form the at least one fourth pole plate 22 in the at least one first via hole 7 respectively; and etching the first metal material by a patterning process to form the source 31, the drain 34 and the second pole plate 12; wherein the orthographic projection of the second pole plate 12 on the base 10 is located outside the range of the orthographic projection of the active layer 32 on the base 10, the source 31 is connected to the active layer 32 through the first metal material deposited in one of the two third via holes 9, and the drain 34 is connected to the active layer 32 through the first metal material deposited in the other of the two third via holes 9.

According to an embodiment provided by the present disclosure, the step S103 of forming the second insulation layer 6 on the first insulation layer 5 may include: depositing a second insulating material on the first insulation layer 5 to form the second insulation layer 6; etching the second insulation layer 6 and the first insulation layer 5 to form the at least one second via hole 8; wherein the orthographic projection of the at least one second via hole 8 on the base 10 is located outside the range of the orthographic projection of the active layer 32 on the base 10 and outside the range of the orthographic projection of the second pole plate 12 on the base 10; and etching the second insulation layer 6 to form a fourth via hole 16 extending to the drain 34 from the side of the second insulation layer 6 distal to the first insulation layer 5.

According to an embodiment provided by the present disclosure, the step S104 of forming the at least one third pole plate 21 and the first pole plate 11 may include: depositing a second metal material on the second insulation layer 6, in the at least one second via hole 8 and in the fourth via hole 16 to form the at least one third pole plate 21 in the at least one second via hole 8 respectively; and etching the second metal material by a patterning process to form the first pole plate 11, where the first pole plate 11 is connected to the drain 34 through the second metal material deposited in the fourth via hole 16.

According to an embodiment provided by the present disclosure, the base may further include a third insulation layer 15. Accordingly, the step of forming the first insulation layer 5 on the base may include: forming the active layer 32 on the third insulation layer 15 and depositing the first insulating material on the third insulation layer 15 to form the first insulation layer 5.

Figure 12:
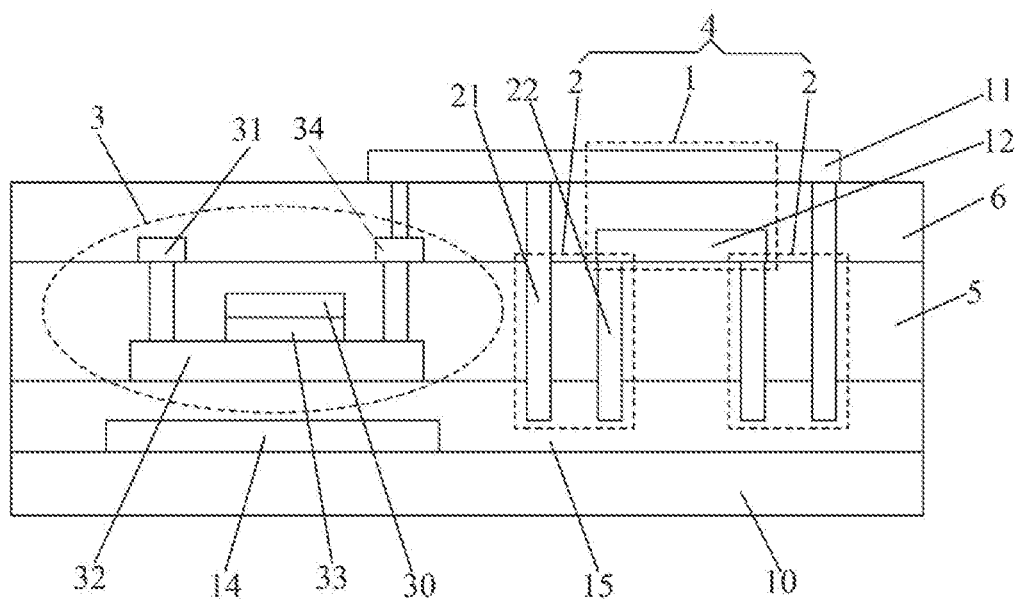
FIG. 12 is yet another partial structural section view of an array substrate provided by an embodiment of the present disclosure.

According to an embodiment provided by the present disclosure, the at least one first via hole 7 penetrates the first insulation layer 5 and extends into the third insulation layer 15; and/or the at least one second via hole 8 penetrates the first insulation layer 5 and extends into the third insulation layer 15, as shown in FIG. 12.

An embodiment of the present disclosure further provides another method for manufacturing the array substrate, which may include: forming a transistor 3 and a capacitor 4, where forming the capacitor 4 may include: forming a main body 1, and forming the capacitor 4 may further include: forming at least one auxiliary body 2 in the insulation layer of the array substrate.

By forming the auxiliary body 2 in the insulation layer of the array substrate, the manufacturing processes of the array substrate will not be increased additionally when the overall capacitance value of the capacitor 4 is increased, so that it can not only prevent the decrease in the capacitance value of the capacitor from affecting the display effect but also ensure that the structural change of the capacitor will not increase the manufacturing processes of the array substrate additionally, in the case of improving the display resolution and the refresh rate by reducing the width of metal lines.

According to an embodiment provided by the present disclosure, the method for manufacturing the array substrate may further include a step of forming a pixel electrode and a step of forming an insulation layer after forming the transistor 3. The step of forming the insulation layer may include the steps of: forming the first insulation layer 5 after forming the active layer 32 of the transistor 3 and before forming the source 31 and the drain 34, and forming the second insulation layer 6 after forming the source 31 and drain 34 and before forming the pixel electrode. The step of forming the main body 1 includes: firstly forming the second pole plate 12 of the main body 1 while forming the source 31 and the drain 34; then forming the second insulation layer 6; and then forming the first pole plate 11 of the main body 1 while forming the pixel electrode; and the step of forming the auxiliary body 2 includes: forming a first portion of the auxiliary body 2.

According to an embodiment provided by the present disclosure, the step of forming the first portion of the auxiliary body 2 may include the following steps S201-S204.

In step S201, when the first insulation layer 5 is formed, the first via holes 7 are formed at the positions where the at least one auxiliary body 2 is formed correspondingly in the first insulation layer 5, as shown in FIG. 8.

In step S202, when the source 31 and the drain 34 are formed, the metal material in the first via holes 7 is retained, as shown in FIG. 9.

In step S203, when the second insulation layer 6 is formed, the second via holes 8 are formed at the positions where the at least one auxiliary body 2 is formed correspondingly in the second insulation layer 6 and the first insulation layer 5, as shown in FIG. 10.

In step S204, when the pixel electrode is formed, the metal material in the second via holes 8 is retained, as shown in FIG. 11.

According to the embodiments provided by the present disclosure, either the first pole plate 11 and the third pole plate 21, or the second pole plate 12 and the fourth pole plate 22, whether they are connected with each other directly or are connected by a wire, the preparation principle thereof is the same, that is, the electrical connection is achieved through via hole(s) provided in the insulation layer(s), which will not be described in detail here.

In this embodiment, other structures of the array substrate may be formed by using the developed traditional processes, which will not be repeated here.

According to an embodiment provided by the present disclosure, the method for manufacturing the array substrate may further include: forming a second portion of the auxiliary body 2. The step of forming the second portion of the auxiliary body 2 includes the step of forming a third insulation layer 15 before forming the active layer 32; when the first via hole 7 is formed, the first via hole 7 penetrates the first insulation layer 5 and extends into the third insulation layer 15; and when the second via hole 8 is formed, the second via hole 8 penetrates the second insulation layer 6 and the first insulation layer 5 and extends into the third insulation layer 15. The formation of the second portion of the auxiliary body 2 will not additionally increase the manufacturing processes of the array substrate, and the formation of the second portion of the auxiliary body 2 can further increase the overall capacitance value of the capacitor 4.

As shown in FIG. 12 that is another partial structural section view of an array substrate provided by an embodiment of the present disclosure, based on the above-described method for manufacturing the array substrate, the third pole plate 21 and the fourth pole plate 22 may also extend into the third insulation layer 15 located on the side of the active layer 32 distal to the source 31; and correspondingly, the auxiliary body 2 further includes the second portion constituted by the pole plate portions of the third pole plate 21 and the fourth pole plate 22 extending into the third insulation layer 15 and the third insulation layer 15.

The additional arrangement of the second portion of the auxiliary body 2 on the basis of the first portion can further increase the facing area of two opposing pole plates of the auxiliary body 2, and thus further increase the capacitance value of the capacitor 4.

According to an embodiment provided by the present disclosure, the third insulation layer 15 may be a buffer layer in the array substrate. Alternatively, the third insulation layer 15 may also be another insulation layer, and any insulation layer may be used as the third insulation layer 15 as long as it is located below the first insulation layer 5 and in contact with the first insulation layer 5.

An embodiment of the present disclosure further provides a display panel, which may include the array substrate provided by the embodiments of the present disclosure.

With the array substrate in the embodiments of the present disclosure, the display panel can increase the overall capacitance value of the capacitor 4 by forming at least one auxiliary body 2 connected in parallel with the main body 1 in the insulation layer of the array substrate in the case of improving the display resolution and the refresh rate by reducing the metal line width, so that the capacitance value of the capacitor will not be decreased due to the decrease in the width of the metal pole plate, thereby ensuring the display effect of the display panel.

The display panel provided by the embodiment of the present disclosure may be an LCD (Liquid Crystal Display) panel, an OLED (Organic Light-Emitting Diode) panel, an LCD TV, an OLED TV, a display, a mobile phone, a navigator, or any other product or component with a display function.

It can be understood that the above embodiments are merely the exemplary embodiments adopted to explain the principle of the present disclosure, but the present disclosure is not limited thereto. One of ordinary skill in the art can make various variations and improvements therein without departing from the spirit and essence of the present disclosure, and these variations and improvements are also considered to be within the protection scope of the present disclosure.

The invention claimed is:

1. An array substrate, comprising a transistor and a capacitor, the capacitor comprising a main body that comprises a first pole plate and a second pole plate disposed opposite to each other; the capacitor further comprising at least one auxiliary body, wherein:
    any one of the at least one auxiliary body comprises a third pole plate and a fourth pole plate disposed opposite to each other, and neither the third pole plate nor the fourth pole plate extends in a plane where the first pole plate is located or a plane where the second pole plate is located;
    the main body is connected in parallel with the at least one auxiliary body;
    the transistor is electrically connected to the capacitor;
    the array substrate further comprises a first insulation layer and a second insulation layer stacked on the first insulation layer; an arrangement direction of the first pole plate and the second pole plate is parallel to an arrangement direction of the first insulation layer and the second insulation layer, an arrangement direction of the third pole plate and the fourth pole plate is perpendicular to the arrangement direction of the first pole plate and the second pole plate; the transistor comprises a source, a drain and an active layer; the active layer and at least one part of each of the at least one auxiliary body are located in the first insulation layer, the source, the drain and the second pole plate are located in the second insulation layer, and the first pole plate is located on the second insulation layer; and
    the array substrate further comprises a third insulation layer stacked under the first insulation layer, and at least one part of each of the at least one auxiliary body is located in the third insulation layer.

2. The array substrate according to claim 1, wherein:
    the first pole plate and the third pole plate extend respectively to be connected with each other, or the first pole plate and the third pole plate are electrically connected by a wire; and
    the second pole plate and the fourth pole plate extend respectively to be connected with each other, or the second pole plate and the fourth pole plate are electrically connected by a wire.

3. The array substrate according to claim 2, wherein:
    materials of the first pole plate and the third pole plate are same; and/or
    materials of the second pole plate, the fourth pole plate, the source and the drain are same.

4. A display panel, comprising the array substrate according to claim 1.

5. A method for manufacturing an array substrate, wherein the array substrate is the array substrate according to claim 1, and the method comprises:
    forming a first insulation layer on a base; wherein an active layer of the transistor is arranged in the first insulation layer, and at least one first via hole is arranged in an upper portion of the first insulation layer distal to the base;
    forming at least one fourth pole plate of the capacitor respectively in the at least one first via hole, and forming a source of the transistor, a drain of the transistor and the second pole plate of the capacitor on the first insulation layer; wherein the second pole plate is electrically connected to the at least one fourth pole plate, and the source and the drain are electrically connected to the active layer respectively;
    forming a second insulation layer on the first insulation layer; wherein at least one second via hole penetrates the second insulation layer and extends into the first insulation layer; and
    forming at least one third pole plate of the capacitor respectively in the at least one second via hole, and forming the first pole plate of the capacitor on the second insulation layer; wherein the first pole plate is electrically connected to the drain and the at least one third pole plate respectively, and an orthographic projection of the first pole plate on the base at least partially covers an orthographic projection of the second pole plate on the base.

6. The method according to claim 5, wherein forming the first insulation layer on the base comprises:
    forming the active layer on the base;
    depositing a first insulating material on the base to form the first insulation layer; and
    etching the first insulation layer to form the at least one first via hole and two third via holes; wherein an orthographic projection of the at least one first via hole on the base is located outside a range of an orthographic projection of the active layer on the base, and the two third via holes extend to the active layer respectively.

7. The method according to claim 6, wherein forming the at least one fourth pole plate, the source, the drain and the second pole plate comprises:
    depositing a first metal material on the first insulation layer, in the at least one first via hole and in the two third via holes to form the at least one fourth pole plate in the at least one first via hole respectively; and
    etching the first metal material by a patterning process to form the source, the drain and the second pole plate; wherein an orthographic projection of the second pole plate on the base is located outside a range of the orthographic projection of the active layer on the base, the source is connected to the active layer through the first metal material deposited in one of the two third via holes, and the drain is connected to the active layer through the first metal material deposited in the other of the two third via holes.

8. The method according to claim 7, wherein forming the second insulation layer on the first insulation layer comprises:
    depositing a second insulating material on the first insulation layer to form the second insulation layer;
    etching the second insulation layer and the first insulation layer to form the at least one second via hole; wherein an orthographic projection of the at least one second via hole on the base is located outside the range of the orthographic projection of the active layer on the base and outside a range of the orthographic projection of the second pole plate on the base; and etching the second insulation layer to form a fourth via hole extending to the drain from a side of the second insulation layer distal to the first insulation layer.

9. The method according to claim 8, wherein forming the at least one third pole plate and the first pole plate comprises:

depositing a second metal material on the second insulation layer, in the at least one second via hole and in the fourth via hole to form the at least one third pole plate in the at least one second via hole respectively; and etching the second metal material by a patterning process to form the first pole plate, wherein the first pole plate is connected to the drain through the second metal material deposited in the fourth via hole.

10. The method according to claim 9, wherein the base comprises a third insulation layer, wherein:

forming the first insulation layer on the base comprises:
forming the active layer on the third insulation layer, and depositing the first insulating material on the third insulation layer to form the first insulation layer.

11. The method according to claim 10, wherein:

the at least one first via hole penetrates the first insulation layer and extends into the third insulation layer; and/or the at least one second via hole penetrates the first insulation layer and extends into the third insulation layer.

12. The array substrate according to claim 1, wherein:

both the third pole plate and the fourth pole plate are located in a region between the first pole plate and the second pole plate; or at least one of the third pole plate and the fourth pole plate is located outside a region between the first pole plate and the second pole plate.

\* \* \* \* \*